(12) United States Patent
Tanaka (10) Patent No.: US 12,087,779 B2
(45) Date of Patent: *Sep. 10, 2024

(54) FLEXIBLE DISPLAY DEVICE THAT SUPPRESSES PEELING OF A LAYERED STRUCTURE

(71) Applicant: SHARP KABUSHIKI KAISHA, Sakai (JP)

(72) Inventor: Tetsunori Tanaka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/217,580

(22) Filed: Jul. 2, 2023

(65) Prior Publication Data

US 2023/0352495 A1 Nov. 2, 2023

Related U.S. Application Data

(63) Continuation of application No. 16/976,735, filed as application No. PCT/JP2018/009075 on Mar. 8, 2018, now Pat. No. 11,735,604.

(51) Int. Cl.
*H01L 27/12* (2006.01)
*H01L 21/683* (2006.01)
*G02F 1/1333* (2006.01)
*H10K 59/12* (2023.01)
*H10K 71/80* (2023.01)

(52) U.S. Cl.
CPC ...... *H01L 27/1266* (2013.01); *H01L 21/6835* (2013.01); *G02F 1/133305* (2013.01); *H01L 2221/68386* (2013.01); *H10K 59/12* (2023.02); *H10K 59/1201* (2023.02); *H10K 71/80* (2023.02)

(58) Field of Classification Search
CPC ............ H01L 27/1266; H01L 21/6835; H10K 59/12
USPC ......................................................... 438/106
See application file for complete search history.

(56) References Cited

U.S. PATENT DOCUMENTS

2011/0260180 A1* 10/2011 Kuranaga ............ H10K 50/844
438/34
2015/0014672 A1* 1/2015 Yamae ................... H05B 33/04
257/40

* cited by examiner

*Primary Examiner* — Xia L Cross
(74) *Attorney, Agent, or Firm* — ScienBiziP, P.C.

(57) ABSTRACT

A barrier film is formed on a resin layer so as to include a missing part where a portion of the barrier film is missing in a central end region of the resin layer.

11 Claims, 6 Drawing Sheets

FLEXIBLE DISPLAY DEVICE THAT SUPPRESSES PEELING OF A LAYERED STRUCTURE

TECHNICAL FIELD

The disclosure relates to a method for manufacturing a flexible display device. The present application is a continuation application of U.S. patent application Ser. No. 16/976,735, filed on Aug. 28, 2020, which is the National Stage of International Application No. PCT/JP2018/009075, filed on Mar. 8, 2018, the contents of which are entirely incorporated herein by reference.

BACKGROUND ART

PTL 1 discloses an example of a method for manufacturing a flexible display device including a laser lift off processing (also referred to as LLO processing).

CITATION LIST

Patent Literature

PTL 1: WO 2015/008642 (published on Jan. 22, 2015)

SUMMARY

Technical Problem

In the method for manufacturing a flexible display device disclosed in PTL 1, in a case where the tensile stress of a resin layer formed on a glass substrate is large and the compressive stress of an inorganic film formed on the resin layer is large, peeling of a layered film of a polyimide film and the inorganic film from a laminate film by curling may occur after LLO processing.

The disclosure has been made to solve the problem described above, and an object of the disclosure is to suppress peeling of a layered film of a resin layer and an inorganic film from a laminate film after LLO processing.

Solution to Problem

In order to solve the problem described above, a method for manufacturing a flexible display device according to an aspect of the disclosure includes the steps of: forming a resin layer on a surface of one side of a non-flexible substrate, the resin layer including a central region, an end region formed surrounding the central region and having a film thickness less than a film thickness of the central region, and a central end region formed surrounding the central region and being surrounded by the end region, the central end region having a film thickness greater than a film thickness of the end region; forming an inorganic film above the resin layer, the inorganic film including a missing part where a portion of the inorganic film is missing in the central end region; peeling the non-flexible substrate from the resin layer by irradiating laser light from a side of the non-flexible substrate; and bonding a flexible substrate to a surface of the resin layer from which the non-flexible substrate is peeled.
Advantageous Effects of Disclosure According to an aspect of the disclosure, it is possible to suppress peeling of the layered film of the resin layer and the inorganic film from the laminate film after LLO processing.

DESCRIPTION OF EMBODIMENTS

First Embodiment

Figure 1:
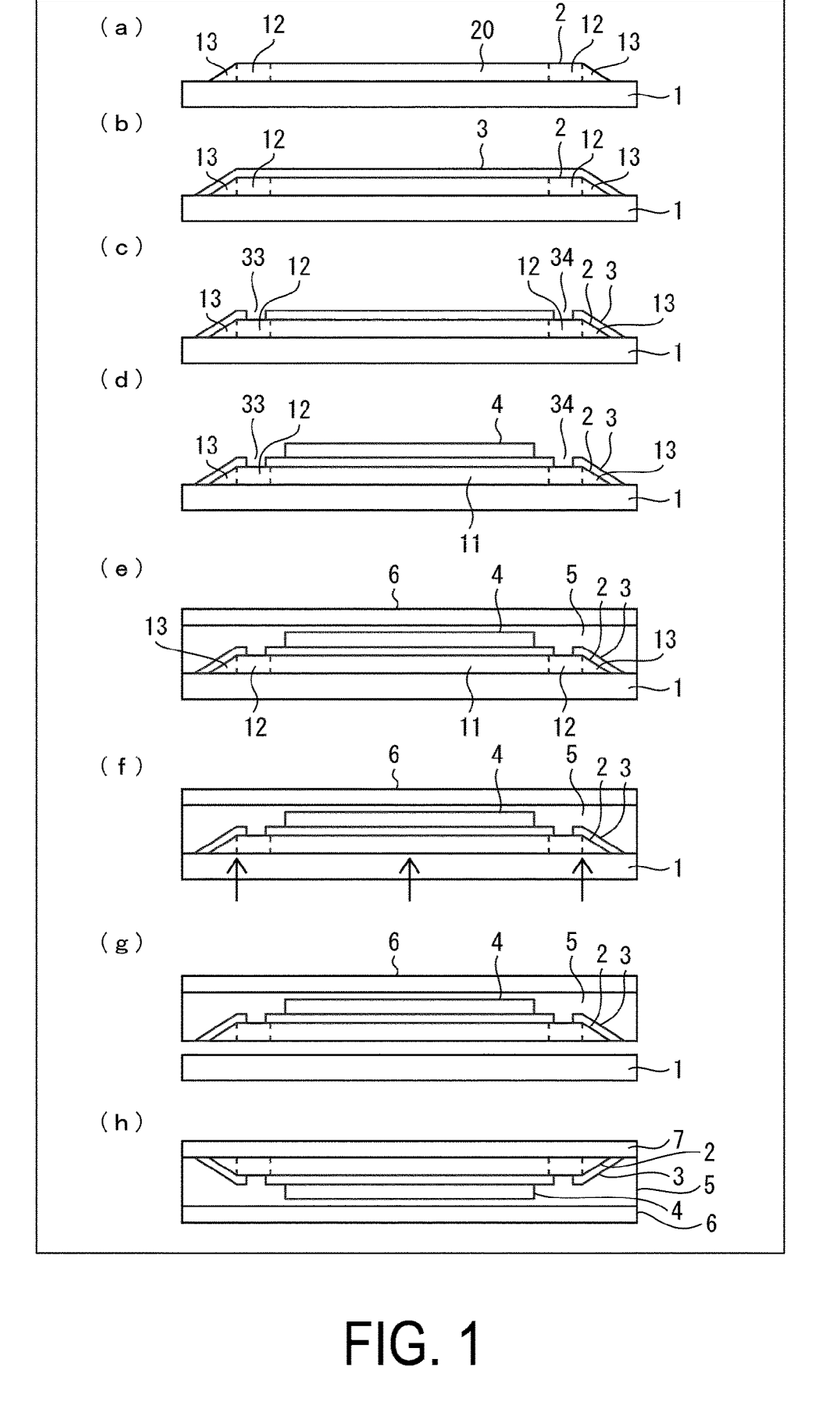
FIG. 1 is a diagram illustrating a method for manufacturing a flexible display device according to one embodiment of the disclosure.

FIG. 1 is a diagram illustrating a method for manufacturing a flexible display device according to one embodiment of the disclosure. As illustrated in (a) of FIG. 1, at the time of starting manufacturing a flexible display device, a slit coater (not illustrated) is used to form a resin layer 2 on a glass substrate 1. The material of the glass substrate 1 is glass. The glass substrate 1 is a kind of non-flexible substrate made of arbitrary rigid material. The material of the resin layer 2 is a resin including polyimide resin, epoxy resin, polyamide resin or the like. The resin layer 2 is formed from a resin and, therefore, has flexibility.
Details of Resin Layer 2

Figure 2:
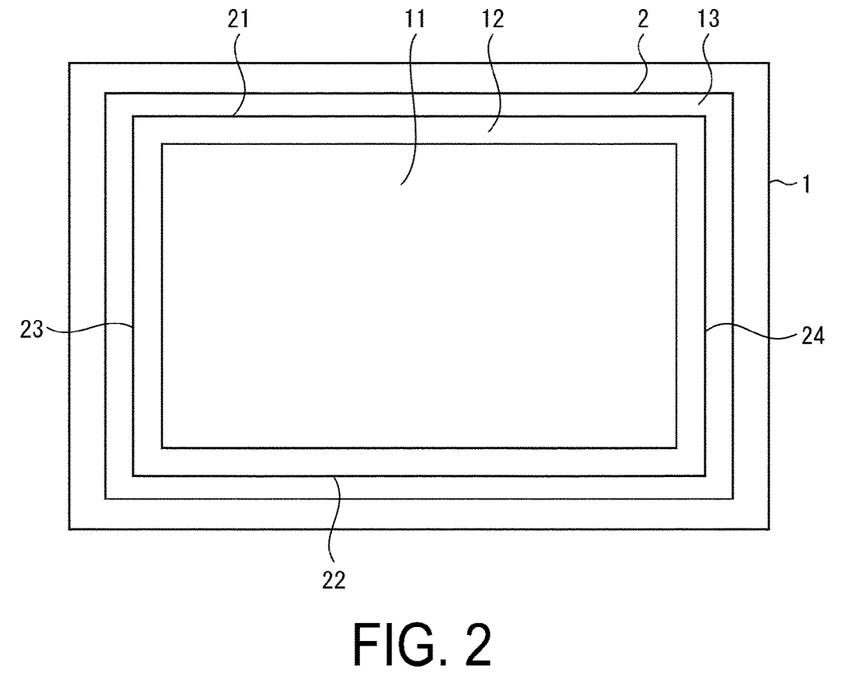
FIG. 2 is a plan view illustrating a detailed configuration of a resin layer formed on a glass substrate.

FIG. 2 is a plan view illustrating a detailed configuration of the resin layer 2 formed on the glass substrate 1. (a) of FIG. 1 illustrates a cross section of the glass substrate 1 and the resin layer 2 illustrated in FIG. 2 in the left and right direction of the sheet. In the present embodiment, as illustrated in (a) of FIG. 1 and FIG. 2, the resin layer 2 is formed on a surface of one side of the glass substrate 1. The resin layer 2 includes a central region 11, a central end region 12, and an end region 13.

The central region 11 has an overall flat shape. The central region 11 has a film thickness that is uniform throughout the central region 11 and greater than the film thickness of the central end region 12.

The central end region 12 is disposed surrounding the central region 11 and surrounded by the end region 13. The central end region 12 has a film thickness that is identical to the film thickness of the central region 11 and is less than the film thickness of the end region 13. The central end region 12 includes an upper side 21, a lower side 22, a left side 23, and a right side 24, disposed at four ends of the central end region 12, respectively. In a plan view, the upper side 21 is disposed on the upper side of the central end region 12, the lower side 22 is disposed on the lower side of the central end region 12, the left side 23 is disposed on the left side of the central end region 12, and the right side 24 is disposed on the right side of the central end region 12. The upper side 21 and the lower side 22 are long sides of the central end region 12, and the left side 23 and the right side 24 are short sides of the central end region 12.

The end region 13 is disposed surrounding the central region 11 and the central end region 12. The end region 13 has an overall angled shape. In other words, the film thickness of the end region 13 continuously decreases from a position adjacent to the central region 11 in the end region 13 to the outermost end of the resin layer 2. The end region 13 has a film thickness that is less than the film thickness of the central region 11.

Formation of Barrier Film 3

After the resin layer 2 is formed, a barrier film 3 is formed on the resin layer 2, as illustrated in (b) of FIG. 1. The barrier film 3 is a kind of inorganic film, and is also referred to as a base coating film. The barrier film 3 serves to prevent moisture and impurities from reaching the active element (TFT) and the display element in a case where the flexible display device is in use. The barrier film 3 may be made of a silicon oxide film, a silicon nitride film, or a silicon oxynitride film, or a layered film thereof, formed using CVD, for example.

In (b) of FIG. 1, the barrier film 3 covering the central region 11, the central end region 12, and the end region 13 is formed on the resin layer 2 by completely depositing the material of the barrier film 3 on the resin layer 2. After formation of the barrier film 3, a portion of the resin layer 2 is not exposed. In other words, all of the central region 11, the central end region 12, and the end region 13 are completely covered by the barrier film 3.

Figure 3:
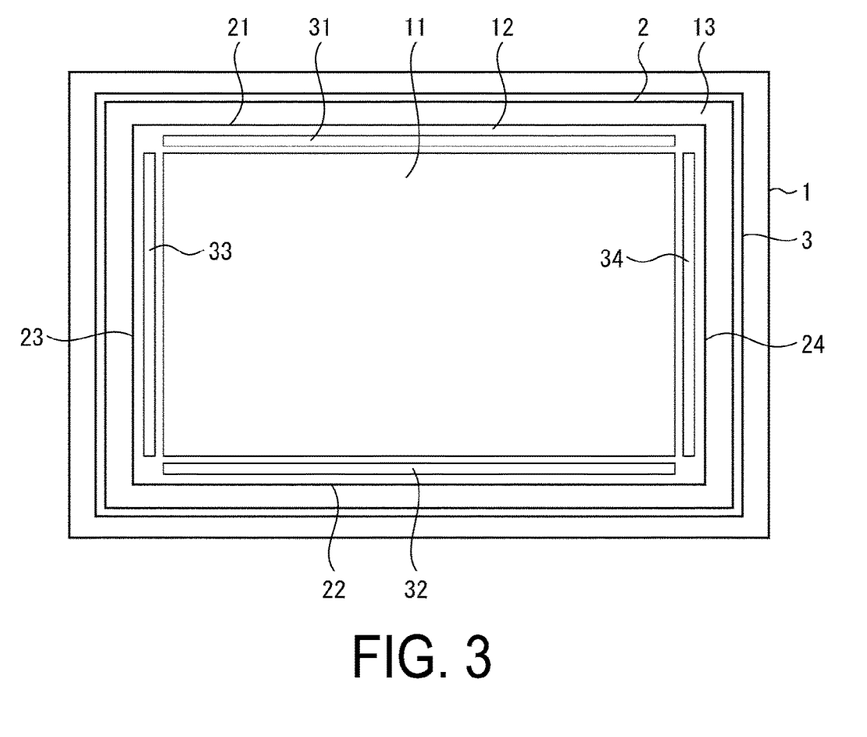
FIG. 3 is a diagram illustrating an example of a barrier film having rectangular missing parts.

In (c) of FIG. 1 and FIG. 3, missing parts 31 to 34 are formed by etching portions of the barrier film 3 corresponding to the missing parts 31 to 34 while leaving the barrier film 3 on the central region 11 and the end region 13. At this time, the adhesive force of the end region 13 with respect to the glass substrate 1 is sufficiently maintained by the barrier film 3 left on the end region 13. Therefore, it is possible to suppress peeling of the resin layer 2 from the glass substrate 1 during etching of the barrier film 3.

FIG. 3 is a diagram illustrating an example of a barrier film 3 having rectangular missing parts 31 to 34. After film formation of the barrier film 3, as illustrated in (c) of FIG. 1 and FIG. 3, a portion of the barrier film 3 is etched at each position individually along the upper side 21, the lower side 22, the left side 23, and the right side 24 of the central end region 12, and missing parts 31 to 34 are formed on the barrier film 3. Etching includes dry etching and wet etching. The missing part 31 is a portion where a portion of the barrier film 3 is missing along the upper side 21 of the central end region 12. The missing part 32 is a portion where a portion of the barrier film 3 is missing along the lower side 22 of the central end region 12. The missing part 33 is a portion where a portion of the barrier film 3 is missing along the left side 23 of the central end region 12. The missing part 34 is a portion where a portion of the barrier film 3 is missing along the right side 24 of the central end region 12. As described above, in (c) of FIG. 1 and FIG. 3, the barrier film 3 having the missing parts 31 to 34 formed along the four different upper side 21, the lower side 22, the left side 23, and the right side 24 of the central end region 12 is formed on the resin layer 2.

Formation of Display Region 4

After the missing parts 31 to 34 are formed, a display region 4 is formed on the barrier film 3, as illustrated in (d) of FIG. 1. Only one display region 4 may be formed on the barrier film 3 or a plurality of display regions 4 may be formed on the barrier film 3 in an island state. The display region 4 includes at least a light-emitting layer, a Thin Film Transistor (TFT) layer, and a sealing film (all not illustrated). The light-emitting layer includes a plurality of display elements (not illustrated). The plurality of display elements are a plurality of light emitting elements which are self-luminous by being applied with a voltage, for example. The plurality of light emitting elements are formed on the light-emitting layer of the display region 4 in a predetermined plane pattern (for example, a matrix pattern). Each of the light emitting elements is, for example, an organic Electro Luminescence (EL) element. The sealing film, which performs a thin film encapsulation (TFE) for the light emitting elements, prevents the respective light emitting elements from being degraded due to moisture or oxygen entering from the outside.

Each of the light emitting elements is not limited to an organic EL element, and may be an inorganic light emitting element or a quantum dot light emitting element. Alternatively, for example, each of the light emitting elements may be a reflective liquid crystal display element in which brightness and transmittance are controlled by voltage and does not require backlight.

After the display region 4 is formed, an adhesive layer 5 covering the barrier film 3 and the display region 4 is formed on the barrier film 3 and the display region 4, respectively, as illustrated in (e) of FIG. 1. Thereafter, as illustrated in (e) of FIG. 1, a laminate film 6 is bonded to the adhesive layer 5. The laminate film 6 is formed from a resin material.

Peeling of Glass Substrate 1

After the laminate film 6 is bonded, the glass substrate 1 is peeled from the resin layer 2 by laser lift off processing (LLO processing). Specifically, as illustrated in (f) of FIG. 1, the resin layer 2 is irradiated with laser light from the glass substrate 1 side. As a result, the physical adhesion of the resin layer 2 with respect to the glass substrate 1 is reduced. Thereafter, a sharp blade is inserted between the resin layer 2 and the glass substrate 1 at the outermost end of the resin layer 2. Subsequently, a physical force is applied in a direction substantially perpendicular to the surface of the resin layer 2 at a position at which the starting point of peeling is generated on the resin layer 2. As a result, as illustrated in (g) of FIG. 1, the glass substrate 1 is peeled from the resin layer 2.

Bonding of Film Substrate 7

After peeling the glass substrate 1, as illustrated in (h) of FIG. 1, a film substrate 7 (flexible substrate) is bonded to the resin layer 2 to the surface where the glass substrate 1 in the resin layer 2 is peeled, via an adhesive layer (not illustrated) provided on a surface of one side of the film substrate 7. This completes the manufacture of the flexible display device.

Advantages of Present Embodiment

In the present embodiment, as illustrated in (f) of FIG. 1, the barrier film 3 does not overlap at positions where the missing parts 31 to 34 in the central end region 12 overlap in the resin layer 2 after the LLO processing. Therefore, in these positions, after the stress of the resin layer 2 and the barrier film 3 is released by the LLO processing, a difference between the amount of contraction of the resin layer 2 and the amount of expansion of the barrier film 3 does not occur, so the force that causes the layered film made of the resin layer 2 and the barrier film 3 to change curly is not exerted on the layered film. As a result, it is possible to suppress peeling of the layered film from the laminate film 6 in a curled manner.

In the present embodiment, it is preferable to form a barrier film 3 having missing parts 31 to 34 having a width of 300 μm or greater. As a result, it is possible to sufficiently widen the positions where the force that deforms the layered film in a curled shape is not exerted, so it is possible to more effectively suppress peeling of the layered film from the laminate film 6.

Various Examples of Arrangements of Missing Parts 31 to 34

Figure 4:
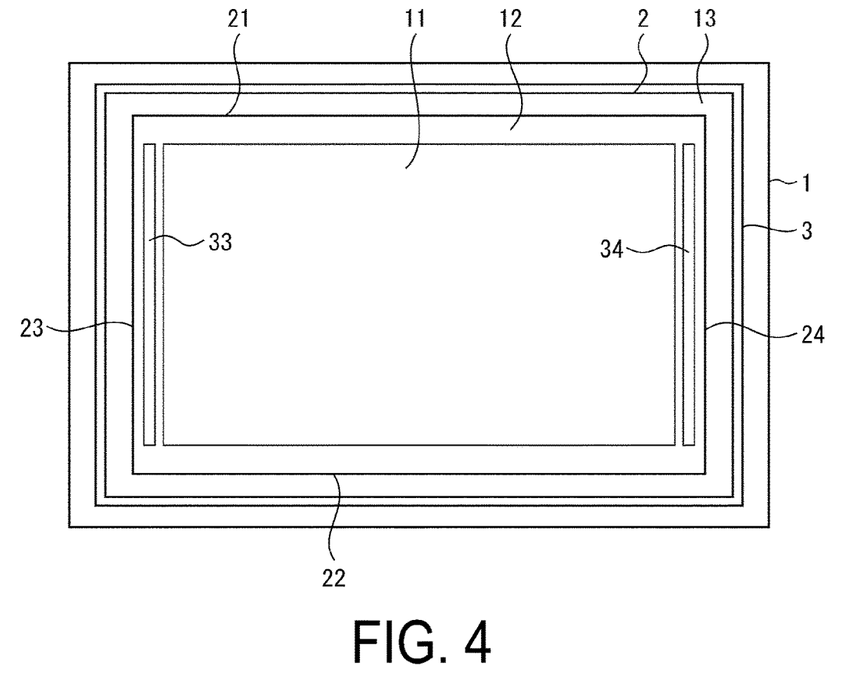
FIG. 4 is a diagram illustrating another arrangement example of missing parts in a barrier film.

FIG. 4 is a diagram illustrating another arrangement example of missing parts 33 and 34 in a barrier film 3. In FIG. 4, a barrier film 3 having only missing parts 33 and 34 of the missing parts 31 to 34 is formed on the resin layer 2. The missing part 33 is formed along the left side 23, which is a short side of the central end region 12. The missing part 34 is formed along the right side 24, which is a short side of the central end region 12. In the example of FIG. 4, at each position overlapping the missing part 33 and the missing part 34 in the central region 11 of the resin layer 2, there is no force exerted that changes the layered film in a curled manner. Therefore, it is possible to suppress peeling of the layered film from the laminate film 6 in a curled manner.

Figure 5:
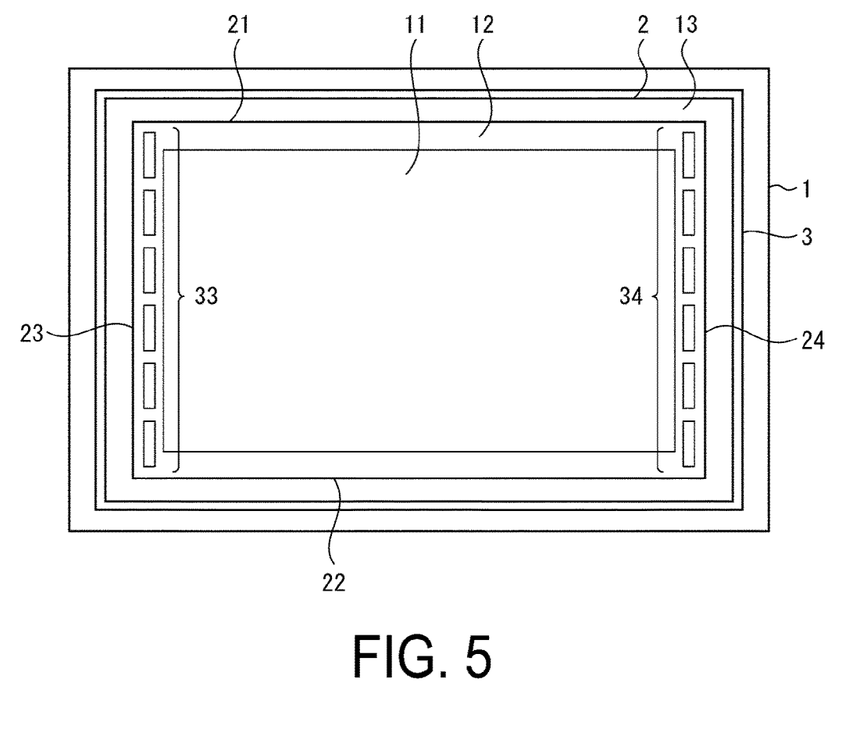
FIG. 5 is a diagram illustrating an arrangement example of a plurality of missing parts and a plurality of missing parts in a barrier film.

FIG. 5 is a diagram illustrating an arrangement example of a plurality of missing parts 33 and a plurality of missing parts 34 in a barrier film 3. In FIG. 5, a barrier film 3 having a plurality of missing parts 33 and a plurality of missing parts 34 arranged in discrete positions is formed on the resin layer 2. The plurality of missing parts 33 are arranged linearly and discretely along the left side 23 in the central end region 12. The plurality of missing parts 34 are arranged linearly and discretely along the right side 24 in the central end region 12. In the example of FIG. 5, in each of the positions where each of the missing parts 33 and each of the missing parts 34 in the central end region 12 of the resin layer 2 overlaps, there is no force exerted that causes the layered film to be in a curled state. Therefore, it is possible to suppress peeling of the layered film from the laminate film 6 in a curled manner.

Figure 6:
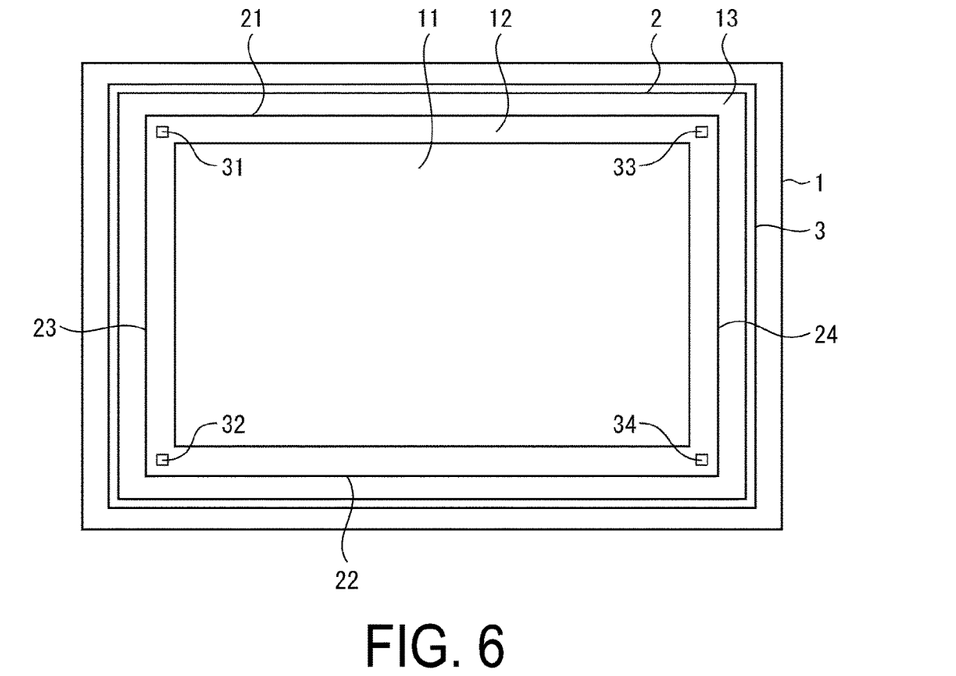
FIG. 6 is a diagram illustrating yet another arrangement example of missing parts of a barrier film.

FIG. 6 is a diagram illustrating yet another arrangement example of missing parts 31 to 34 in a barrier film 3. In the example of FIG. 6, a barrier film 3 having four missing parts 31 to 34 at four corners in the central end region 12 is formed on the resin layer 2. In a plan view, the missing part 31 is a position where a portion of the barrier film 3 is missing in the upper right corner of the central end region 12. The missing part 32 is a position where a portion of the barrier film 3 is missing in the upper left corner of the central end region 12. The missing part 33 is a position where a portion of the barrier film 3 is missing in the lower right corner of the central end region 12. The missing part 34 is a position where a portion of the barrier film 3 is missing in the lower left corner of the central end region 12.

In the example of FIG. 6, the effect of pinning the resin layer 2 to the glass substrate 1 by the missing parts 31 to 34 acts on the resin layer 2. Therefore, it is possible to suppress peeling of the layered film from the laminate film 6 in a curled manner. Furthermore, in the example of FIG. 6, the area of the barrier film 3 to be etched can be minimized, so the pattern region where wiring line or the like on the resin layer 2 is formed can be maximized.

The barrier film 3 need not necessarily have all of the missing parts 31 to 34. In other words, the barrier film 3 may have at least one of the missing parts 31 to 34.

In forming the barrier film 3, the step of etching a portion of the barrier film 3 is not necessarily required. For example, in a case of depositing the barrier film 3 on the resin layer 2, the barrier film 3 including the missing parts 31 to 34 can be formed by masking the missing parts 31 to 34 and not depositing the material of the barrier film 3 on the central end region 12. In this case, it is possible to omit the step of etching a portion of the barrier film 3, so it is possible to further simplify the method for manufacturing the flexible display device.

Overlapping with End Region

Figure 7:
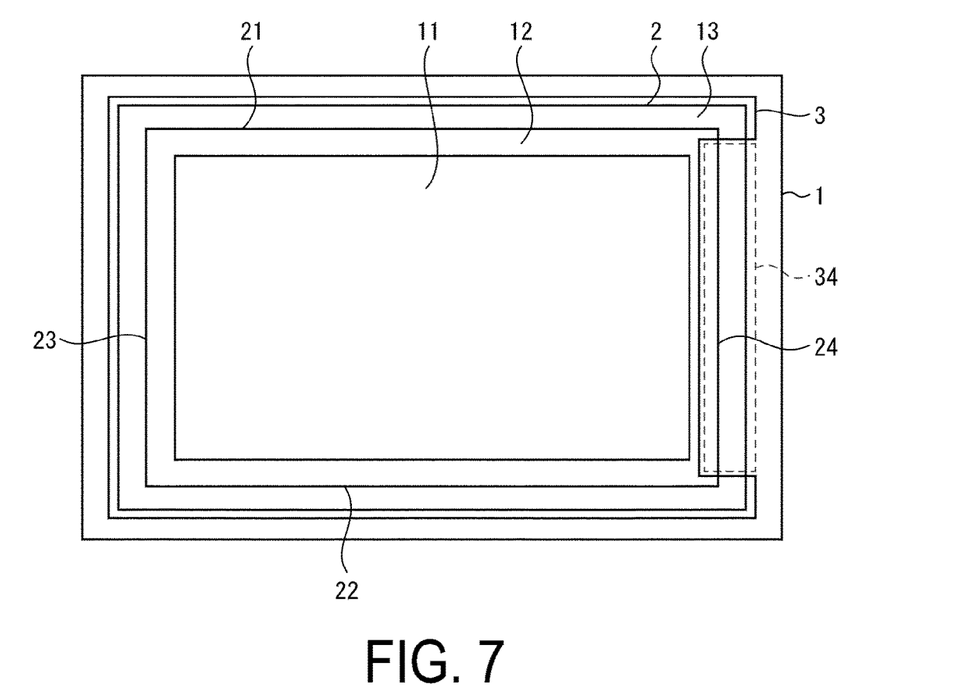
FIG. 7 is a diagram illustrating an example of a missing part overlapping an end region.

FIG. 7 is a diagram illustrating an example of a missing part 34 overlapping in the end region 13. In FIG. 7, a barrier film 3 having a missing part 34 that overlaps a position along the right side 24 in the central end region 12 and a position along the right side 24 of the central end region 12 in the end region 13 is formed on the resin layer 2. The missing part 34 does not overlap a position along the upper side 21 in the end region 13 and a position along the lower side 22 in the end region 13. In other words, the missing part 34 extends from a position along the right side 24 in the end region 13 to a position overlapping the outermost edge on the right side 24 side of the end region 13 without overlapping a position along the upper side 21 in the end region 13 and a position along the lower side 22 in the end region 13.

The barrier film 3 having the missing part 34 illustrated in FIG. 7 is formed, for example, as follows. First, the material of the barrier film 3 is deposited over the entire surface of the resin layer 2. Subsequently, a portion of the barrier film 3 along the right side 24 in the central end region 12 and a portion of the barrier film 3 along the right side 24 of the central end region 12 in the end region 13 are simultaneously etched. Alternatively, in a case of depositing the material of the barrier film 3 on the resin layer 2, the barrier film 3 including the missing part 34 can be formed on the resin layer 2 by masking the missing part 34 illustrated in FIG. 7 and not depositing the material of the barrier film 3.

The missing part 34 illustrated in FIG. 7 is not formed at a position along the upper side 21 in the end region 13 and a position along the lower side 22 in the end region 13. The barrier film 3 is formed at a position along the upper side 21 in the end region 13 and a position along the lower side 22 in the end region 13.

Missing parts 31 to 33 can also be arranged in the same manner as the missing part 34 illustrated in FIG. 7. In particular, the barrier film 3 can have a missing part 31 that overlaps a position along the upper side 21 in the central end region 12 and a position along the upper side 21 in the end region 13. The barrier film 3 can have a missing part 32 that overlaps a position along the lower side 22 in the central end region 12 and a position along the lower side 22 in the end region 13. The barrier film 3 can have a missing part 33 that overlaps a position along the left side 23 in the central end region 12 and a position along the left side 23 in the end region 13.

Figure 8:
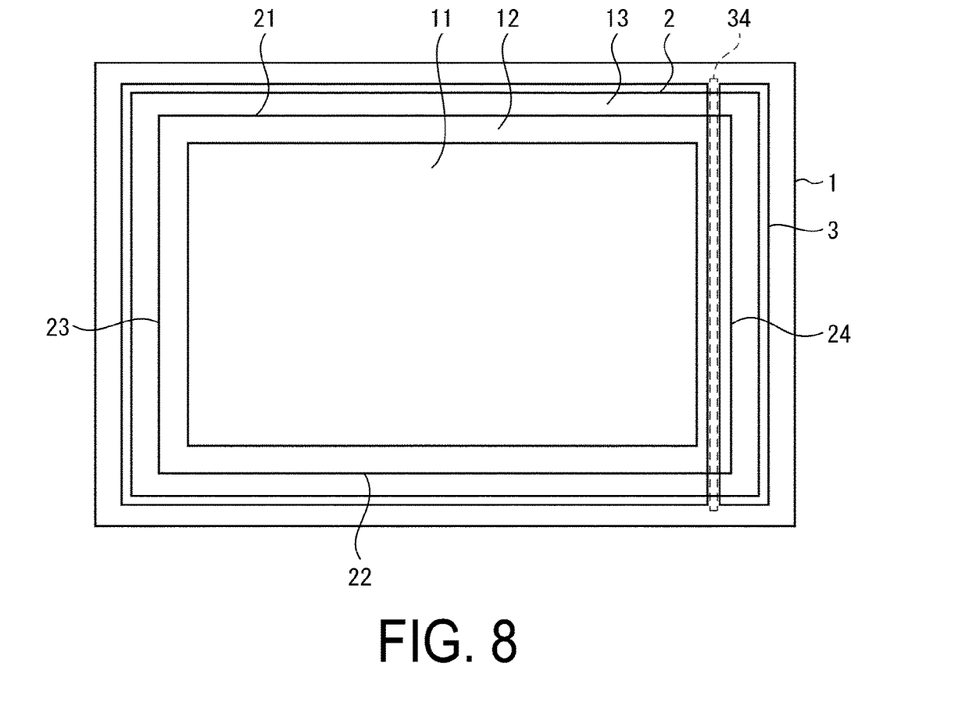
FIG. 8 is a diagram illustrating another example of a missing part overlapping an end region.

FIG. 8 is a diagram illustrating another example of a missing part 34 overlapping the end region 13. In FIG. 8, a barrier film 3 having a missing part 34 that overlaps a position along the right side 24 in the central end region 12, a position along the upper side 21 in the end region 13, and a portion along the lower side 22 in the end region 13 is formed on the resin layer 2. The missing part 34 does not overlap the position along the right side 24 in the end region 13. In other words, the missing part 34 extends from a position overlapping the outermost end on the upper side 21 side of the barrier film 3 to a position overlapping the outermost end on the lower side 22 side without overlapping the position along the right side 24 in the end region 13.

The barrier film 3 having the missing part 34 illustrated in FIG. 8 is formed, for example, as follows. First, the material of the barrier film 3 is deposited over the entire surface of the resin layer 2. Subsequently, a portion of the barrier film 3 along the upper side 21 in the central end region 12 and a portion of the barrier film 3 along the lower side 22 of the central end region 12 in the end region 13 are simultaneously etched. Alternatively, in a case of depositing the material of the barrier film 3 on the resin layer 2, the barrier film 3 including the missing part 34 can be formed on the resin layer 2 by masking the missing part 34 illustrated in FIG. 8 and not depositing the material of the barrier film 3.

Missing parts 31 to 33 can also be arranged in the same manner as the missing part 34 illustrated in FIG. 8. In particular, the barrier film 3 can have a missing part 31 that overlaps a position along the upper side 21 in the central end region 12, a position along the left side 23 in the end region 13, and a position along the right side 24 in the end region 13. The barrier film 3 can have a missing part 32 that overlaps a position along the lower side 22 in the central end region 12, a position along the left side 23 in the end region 13, and a portion along the right side 24 in the end region 13. The barrier film 3 can have a missing part 33 that overlaps a position along the left side 23 in the central end region 12, a position along the upper side 21 in the end region 13, and a portion along the lower side 22 in the end region 13.

Figure 9:
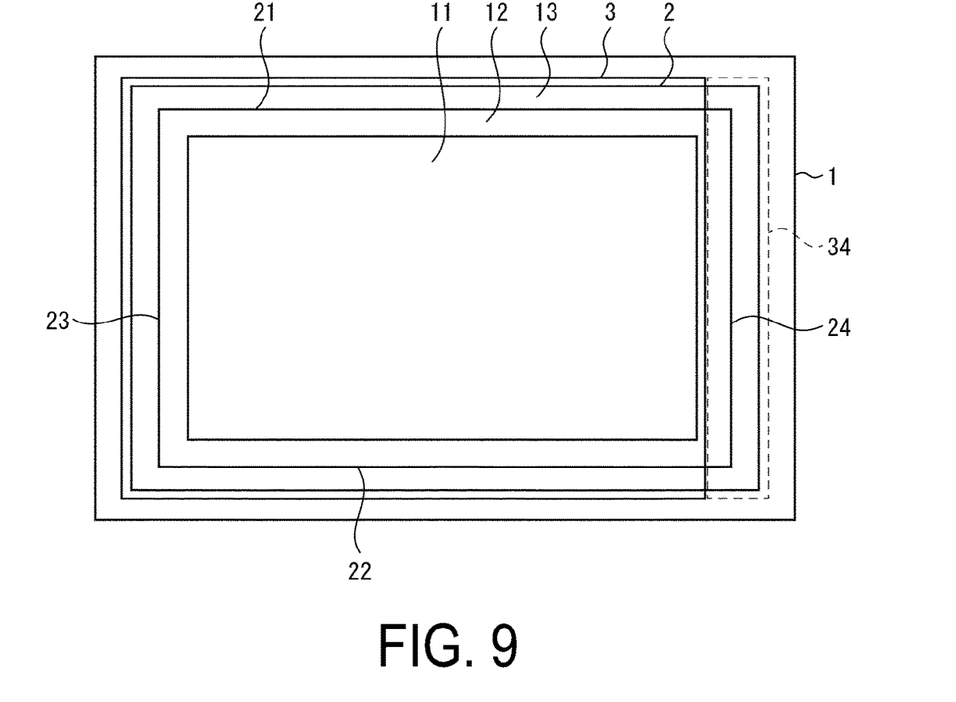
FIG. 9 is a diagram illustrating yet another example of a missing part overlapping an end region.

FIG. 9 is a diagram illustrating yet another example of a missing part 34 overlapping the end region 13. In FIG. 9, a barrier film 3 having a missing part 34 that overlaps a position along the right side 24 in the central end region 12, a position along the upper side 21 in the end region 13, a portion along the lower side 22 in the end region 13, and a portion along the right side 24 in the end region 13 is formed on the resin layer 2. The missing part 34 extends from a position overlapping the outermost end on the upper side 21 side of the barrier film 3 to a position overlapping the outermost end on the lower side 22 side while overlapping a position along the right side 24 in the end region 13.

The barrier film 3 having the missing part 34 illustrated in FIG. 9 is formed, for example, as follows. First, the material of the barrier film 3 is deposited over the entire surface of the resin layer 2. Subsequently, a portion of the barrier film 3 along the right side 24 in the central end region 12 and a portion of the barrier film 3 along the upper side 21 in the end region 13 are simultaneously etched with a portion of the barrier film 3 along the lower side 22 in the end region 13 and a portion of the barrier film 3 along the right side 24 in the end region 13. Alternatively, in a case of depositing the material of the barrier film 3 on the resin layer 2, the barrier film 3 including the missing part 34 can be formed on the resin layer 2 by masking the missing part 34 illustrated in FIG. 9 and not depositing the material of the barrier film 3.

In the examples of FIG. 7 to FIG. 9, in a case of depositing the material of the barrier film 3, the barrier film 3 that does not cover at least a portion of the end region 13 is formed by masking at least a portion of the end regions 13 and not depositing the material of the barrier film 3 in the end region 13. In other words, in the examples of FIG. 7 to FIG. 9, in addition to a position along the right side 24 in the central end region 12, the barrier film 3 also does not exist on at least a portion of at least any of a position along the upper side 21 in the end region 13, a position along the lower side 22 in the end region 13, and a position along the right side 24 in the end region 13. As a result, it is possible to more effectively suppress the force that causes the layered film to curl from the right side 24 side of the resin layer 2 from being exerted on the layered film.

Formation of Plurality of Inorganic Films

Figure 10:
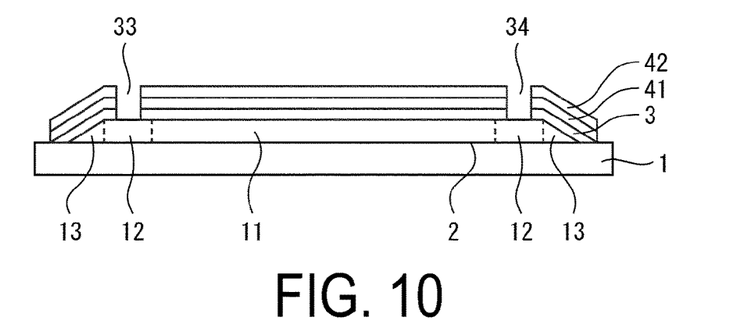
FIG. 10 is a diagram illustrating the formation of missing parts that penetrate a barrier film, an inorganic film, and an inorganic film.

FIG. 10 is a diagram illustrating the formation of missing parts 31 to 34 that penetrate a barrier film 3, an inorganic film 41, and an inorganic film 42. In FIG. 10, the missing parts 31 and 32 are not illustrated. In FIG. 10, a barrier film 3 and a plurality of inorganic films are formed on the resin layer 2. Specifically, the barrier film 3 is first formed on the resin layer 2. Next, a plurality of inorganic films 41 and 42 that constitute the TFT layer are formed on the barrier film 3. The plurality of inorganic films formed at this time are not limited to two layers, but may be three or more layers. The inorganic film 41 is, for example, a gate insulating film, and the inorganic film 42 is, for example, another insulating film disposed on the gate insulating film.

In FIG. 10, the barrier film 3, the inorganic film 41, and the inorganic film 42 are formed so that all of the barrier film 3, the inorganic film 41, and the inorganic film 42 have the missing parts 31 to 34. Specifically, first, the material of the barrier film 3 is formed over the entire surface of the resin layer 2. Next, the material of the inorganic film 41 is deposited on the entire surface of the barrier film 3, and then the material of the inorganic film 42 is deposited on the entire surface of the inorganic film 41. Thereafter, a portion of the barrier film 3, the inorganic film 41, and the inorganic film 42 are simultaneously etched in the central end region 12. As a result, the missing parts 31 to 34 that penetrate the barrier film 3, the inorganic film 41, and the inorganic film 42 are formed on the central end region 12.

The barrier film 3, the inorganic film 41, and the inorganic film 42 can be formed such that only the barrier film 3 includes the missing parts 31 to 34. In this case, after depositing the material of the barrier film 3, the missing parts 31 to 34 are formed on the barrier film 3. Next, the materials of the inorganic film 41 and the inorganic film 42 are deposited on the barrier film 3 so as to cover the entire barrier film 3 including the missing parts 31 to 34. In this configuration, the missing parts 31 to 34 are formed in the thickest barrier film 3 of the barrier film 3, the inorganic film 41, and the inorganic film 42, a force that causes the layered film to curl does not act on the layered film.

As described above, by forming the barrier film 3, the inorganic film 41, and the inorganic film 42 so that at least the barrier film 3 includes the missing parts 31 to 34 among the barrier film 3, the inorganic film 41, and the inorganic film 42, it is possible to sufficiently suppress the peeling of the layered film from the laminate film 6. In addition to the barrier film 3, if the missing parts 31 to 34 are formed in the inorganic film 41 and the inorganic film 42, peeling of the layered film from the laminate film 6 can be more effectively suppressed.

A glass substrate 1 according to the present embodiment is also included in one aspect of the disclosure. The glass substrate 1 is provided with a resin layer 2 and a barrier film 3. The resin layer 2 is formed on a surface of one side of the glass substrate 1. The resin layer 2 includes a central region 11, a central end region 12, and an end region 13. The end region 13 is formed surrounding the central region 11 and has a film thickness greater than the film thickness of the central region 11. The central end region 12 is formed to surround the central region 11 and to be surrounded by the end region 13, and has a film thickness that is greater than the film thickness of the central region 11. The barrier film 3 has missing parts 31 to 34 in which a portion of the barrier film 3 is missing in the central end region 12, and is formed above the resin layer 2.

Second Embodiment

Figure 11:
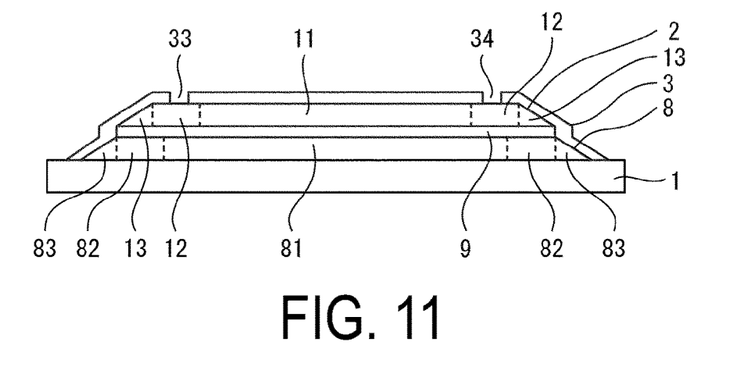
FIG. 11 is a diagram illustrating the formation of the missing parts according to a second embodiment.

FIG. 11 is a diagram illustrating the formation of missing parts 31 to 34 according to the second embodiment. In FIG. 11, the missing parts 31 and 32 are not illustrated. In the example of FIG. 11, two layers of a resin layer 2 (second resin layer) and a resin layer 8 (first resin layer) are formed on the glass substrate 1.

First, a resin layer 8 is formed on the glass substrate 1. The material of the resin layer 8 is a resin including polyimide resin, epoxy resin, polyamide resin or the like. The resin layer 8 is formed from a resin and, therefore, has flexibility. As a whole, the resin layer 8 has the same configuration and shape as the resin layer 2. Specifically, the resin layer 8 includes a central region 81, a central end region 82, and an end region 83. The central region 81 has an overall flat shape. The film thickness of the central region 81 is uniform throughout the central region 81 and is greater than the film thickness of the central end region 82. The central end region 82 is disposed surrounding the central region 81 and surrounded by the end region 83. The film thickness of the central end region 82 is the same as the film thickness of the central region 81 and is less than the film thickness of the end region 83. The central end region 82 includes an upper side 21, a lower side 22, a left side 23, and a right side 24. In a plan view, the upper side 21 is disposed on the upper side of the central end region 82, the lower side 22 is disposed on the lower side of the central end region 82, the left side 23 is disposed on the left side of the central end region 82, and the right side 24 is disposed on the right side of the central end region 82. The end region 83 is disposed surrounding the central region 81 and the central end region 82. The end region 83 has an overall angled shape. In other words, the film thickness of the end region 83 continuously decreases from a position adjacent to the central region 81 in the end region 83 to the outermost end of the resin layer 88. The film thickness of the end region 83 is less than the film thickness of the central region 81.

After forming the resin layer 8, an intermediate layer 9 is provided on the resin layer 2. The intermediate layer 9 is a type of inorganic film. After the intermediate layer 9 is formed, the resin layer 2 is formed on the intermediate layer 9. The configuration and shape of the resin layer 2 are as illustrated in FIG. 2, and thus detailed descriptions thereof will not be repeated.

In the example of FIG. 11, the resin layer 2 is formed from the same thickness and the same material as the resin layer 8. Specifically, the thickness of the central region 11 of the resin layer 2 is matched to the thickness of the central region 81 of the resin layer 8. Furthermore, the thickness of the central end region 12 of the resin layer 2 is matched with the thickness of the central end region 82 of the resin layer 8. A barrier film 3 having missing parts 31 to 34 in the central end region 12 is formed on the resin layer 2. The missing parts 31 to 34 are not formed in the intermediate layer 9 formed on the resin layer 8.

Figure 12:
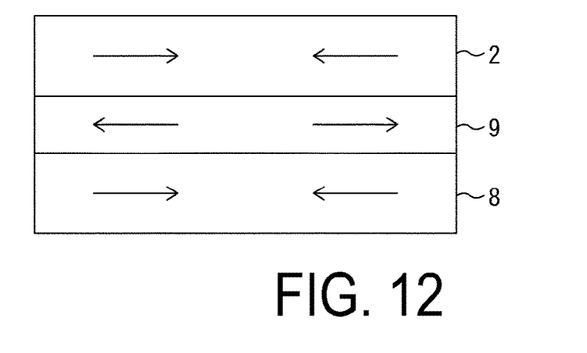
FIG. 12 is a diagram illustrating advantages of the second embodiment.

FIG. 12 is a diagram illustrating advantages of the second embodiment. Before the LLO processing is performed, tensile stress acts on the resin layer 2 and the resin layer 8 on the glass substrate 1, while compressive stress acts on the intermediate layer 9. After the glass substrate 1 is peeled from the resin layer 8 by the LLO processing, the stresses that were acting to the resin layer 2, the resin layer 8, and the intermediate layer 9 respectively are released. As a result, as illustrated in FIG. 12, the resin layer 2 and the resin layer 8 shrink, while the intermediate layer 9 expands. Here, the resin layer 2 and the resin layer 8 are formed of the same material, and the thickness of the central region 11 of the resin layer 2 and the thickness of the central region 81 of the resin layer 8 are the same. Therefore, the resin layer 2 and the resin layer 8 shrink in the same manner with the intermediate layer 9 as a boundary. As a result, the force that deforms the layered film formed from the resin layer 2, the resin layer 8, and the barrier film 3 in a curled shape is not exerted on the layered film, so it is possible to suppress peeling of the layered film from the laminate film 6 in a curled manner.

Third Embodiment

Figure 13:
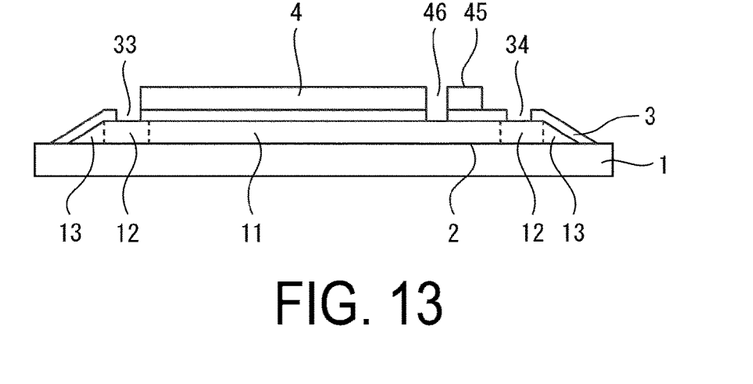
FIG. 13 is a diagram illustrating a method for manufacturing a flexible display device including a terminal portion and a bending portion according to a third embodiment.

FIG. 13 is a diagram illustrating a method for manufacturing a flexible display device having a bending portion 46 according to the third embodiment. In the example of FIG. 13, after forming the barrier film 3, a display region 4 and a terminal portion 45 disposed next to the display region 4 with a bending portion 46 interposed therebetween in the flexible display device is formed on the barrier film 3. At this point, the bending portion 46 and the missing parts 31 to 34 are not yet formed.

In the example of FIG. 13, after the display region 4 and the terminal portion 45 are formed, the bending portion 46 and the missing parts 31 to 34 are simultaneously formed by simultaneously etching a portion of the barrier film 3 in the bending portion 46 disposed between the display region 4 and the terminal portion 45 of the flexible display device, and a portion of the barrier film 3 in the central region 11. In this configuration, it is not necessary to separately etch the position of the barrier film 3 overlapping the bending portion 46 in the barrier film 3 and etch the positions corresponding to the missing parts 31 to 34 in the barrier film 3. Accordingly, a method for manufacturing a flexible display device having a bending portion 46 can be simplified.

Supplement

Aspect 1: A method for manufacturing a flexible display device, the method including the steps of: forming a resin layer on a surface of one side of a non-flexible substrate, the resin layer including a central region, an end region formed surrounding the central region and having a film thickness less than a film thickness of the central region, and a central end region formed surrounding the central region and being surrounded by the end region, the central end region having a film thickness greater than a film thickness of the end region; forming an inorganic film above the resin layer, the inorganic film including a missing part where a portion of the inorganic film is missing in the central end region; peeling the non-flexible substrate from the resin layer by irradiating laser light from a side of the non-flexible substrate; and bonding a flexible substrate to a surface of the resin layer from which the non-flexible substrate is peeled.

Aspect 2: The method for manufacturing according to Aspect 1, wherein in the step of forming the inorganic film, the inorganic film including the missing part formed along at least one side in the central end region is formed.

Aspect 3: The method for manufacturing according to Aspect 2, wherein in the step of forming the inorganic film, the inorganic film including four of the missing part formed individually along each of four different sides in the central end region is formed.

Aspect 4: The method for manufacturing according to Aspect 2, wherein in the step of forming the inorganic film, the inorganic film including the missing part formed only along a short side in the central end region is formed.

Aspect 5: The method for manufacturing according to Aspect 1, wherein in the step of forming the inorganic film, the inorganic film including the missing part formed in at least one corner in the central end region is formed.

Aspect 6: The method for manufacturing according to Aspect 1, wherein in the step of forming the inorganic film, the inorganic film including four of the missing part formed individually in each of four different corners in the central end region is formed.

Aspect 7: The method for manufacturing according to Aspects 1 to 6, wherein in the step of forming the inorganic film, the inorganic film including a plurality of the missing parts arranged in discrete positions is formed.

Aspect 8: The method for manufacturing according to any one of Aspects 1 to 7, wherein in the step of forming the inorganic film, the inorganic film including the missing part having a rectangular shape is formed.

Aspect 9: The method for manufacturing according to any one of Aspects 1 to 8, wherein in the step of forming the inorganic film, in a case of depositing a material of the inorganic film on the resin film, the inorganic film including the missing part is formed by masking the missing part and not depositing the material of the inorganic film.

Aspect 10: The method for manufacturing according to any one of Aspects 1 to 8, wherein in the step of forming the inorganic film, the missing part is formed on the inorganic film by completely depositing a material of the inorganic film on the resin film, and then etching a portion of the inorganic film in the central end region.

Aspect 11: The method for manufacturing according to Aspect 8, wherein in the step of forming the inorganic film, the missing part is formed on the inorganic film by simultaneously etching a portion of the inorganic film in a bending portion disposed between a display region and a terminal portion of the flexible display device and a portion of the inorganic film in the central end region.

Aspect 12: The method for manufacturing according to any one of Aspects 1 to 11, wherein in forming the resin layer, a first resin layer is formed on a surface of one side of the non-flexible substrate, then an intermediate layer is formed on the first resin layer, and then a second resin layer is formed on the intermediate layer, and in the step of forming the inorganic film, the inorganic film including the missing part is formed on the second resin layer.

Aspect 13: The method for manufacturing according to Aspect 12, wherein in the step of forming the second resin layer, the second resin layer having a same thickness as the first resin layer is formed.

Aspect 14: The method for manufacturing according to Aspect 12 or 13, wherein in the step of forming the second resin layer, the second resin layer is formed from a same material as a material of the first resin layer.

Aspect 15: The method for manufacturing according to any one of Aspects 1 to 14, wherein in the step of forming the inorganic film, a barrier film including the missing part is formed on the resin layer, and then a plurality of inorganic films forming a TFT layer are formed on the barrier film.

Aspect 16: The method for manufacturing according to Aspect 15, wherein in the step of forming the inorganic film, the plurality of inorganic films each including the missing part is formed.

Aspect 17: The method for manufacturing according to any one of Aspects 1 to 16, wherein in the step of forming the inorganic film, the inorganic film including the missing part having a width of 300 µm or greater is formed.

Aspect 18: The method for manufacturing according to any one of Aspects 1 to 17, wherein in the step of forming the inorganic film, the inorganic film completely covering the end region is formed.

Aspect 19: The method for manufacturing according to any one of Aspects 1 to 17, wherein in the step of forming the inorganic film, in a case of depositing a material of the inorganic film, the inorganic film not covering at least a portion of the end region is formed by masking at least a portion of the end portion and not depositing the material of the inorganic film.

Aspect 20: The method for manufacturing according to any one of Aspects 1 to 17, wherein in the step of forming the inorganic film, the inorganic film not covering at least a portion of the end region is formed by completely depositing a material of the inorganic film on the resin film, and then etching a portion of the inorganic film in the end region.

Aspect 21: The method for manufacturing the flexible display device according to any one of Aspects 1 to 20, wherein the resin layer is a polyimide resin.

Aspect 22: A non-flexible substrate including: a resin layer formed on a surface of one side of the non-flexible substrate, the resin layer including a central region, an end region formed surrounding the central region and having a film thickness less than a film thickness of the central region, and a central end region formed surrounding the central region and being surrounded by the end region, the central end region having a film thickness greater than a film thickness of the end region; and an inorganic film formed above the resin layer, the inorganic film including a missing part where a portion of the inorganic film is missing in the central end region.

Additional Items

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

The invention claimed is:

1. A flexible display device, comprising:
a resin layer formed on a surface of one side of a flexible substrate; and
an inorganic film formed above the resin layer,
wherein the resin layer includes:
   a central region;
   an end region formed surrounding the central region and having a film thickness less than a film thickness of the central region; and
   a central end region formed surrounding the central region and being surrounded by the end region, the central end region having a film thickness greater than the film thickness of the end region, and
the inorganic film includes:
   four missing parts where a portion of the inorganic film is missing in the central end region, the four missing parts being formed individually along each of four different sides in the central end region.

2. The flexible display device according to claim 1, wherein in a case of depositing a material of the inorganic film on the resin film, the four missing parts are formed on the inorganic film by masking the four missing parts and not depositing the material of the inorganic film.

3. The flexible display device according to claim 1, wherein the four missing parts are formed on the inorganic film by completely depositing a material of the inorganic film on the resin film, and then etching a portion of the inorganic film in the central end region.

4. The flexible display device according to claim 1, wherein a barrier film including the four missing parts is formed on the resin layer, as the inorganic film, and then a plurality of other inorganic films forming a TFT layer is formed on the barrier film.

5. The flexible display device according to claim 1, wherein the inorganic film includes the four missing parts each having a width of 300 μm or greater.

6. The flexible display device according to claim 1, wherein the inorganic film is formed to completely cover the end region.

7. The flexible display device according to claim 1, wherein, in a case of depositing a material of the inorganic film, the inorganic film not covering at least a portion of the end region is formed by masking at least a portion of the end portion and not depositing the material of the inorganic film.

8. The flexible display device according to claim 1, wherein the inorganic film not covering at least a portion of the end region is formed by completely depositing a material of the inorganic film on the resin film, and then etching a portion of the inorganic film in the end region.

9. The flexible display device according to claim 1, wherein the resin layer is a polyimide resin.

10. A flexible display device, comprising:
a resin layer formed on a surface of one side of a flexible substrate; and
an inorganic film formed above the resin layer,
wherein the resin layer includes:
   a central region;
   an end region formed surrounding the central region and having a film thickness less than a film thickness of the central region; and
   a central end region formed surrounding the central region and being surrounded by the end region, the central end region having a film thickness greater than the film thickness of the end region, and
the inorganic film includes:
   four missing parts where a portion of the inorganic film is missing in the central end region, the four missing parts being formed individually along each of four different corners in the central end region.

11. The flexible display device according to claim 10, wherein the inorganic film including the four missing parts each having a rectangular shape is formed.

* * * * *